United States Patent [19]

Murata

[11] Patent Number: 4,694,410

[45] Date of Patent: Sep. 15, 1987

[54] PHYSICAL QUANTITY INDICATING DEVICE BY A POINTER

[75] Inventor: Mitsuhiro Murata, Sayama, Japan

[73] Assignee: Citizen Watch Co., Ltd., Tokyo, Japan

[21] Appl. No.: 759,014

[22] Filed: Jul. 24, 1985

[30] Foreign Application Priority Data

Jul. 26, 1984 [JP] Japan ................... 59-113778
May 24, 1985 [JP] Japan ................... 60-111491

[51] Int. Cl.⁴ .................... G01L 13/06; G06F 15/20
[52] U.S. Cl. ..................... 364/558; 364/556;
364/418; 368/10; 368/11; 324/326; 73/4 R;
73/290 R; 73/700; 73/753
[58] Field of Search .......... 73/4 R, 293, 290 R,
73/700, 753; 116/227; 364/556, 558, 562, 418,
130, 174, 400; 340/618; 324/326; 368/10, 11;
318/490

[56] References Cited

U.S. PATENT DOCUMENTS

| | | |
|---|---|---|
| 3,793,511 | 2/1974 | Bela et al. ................ 364/174 |
| 4,336,591 | 6/1982 | Berdzar et al. ........... 364/418 |
| 4,377,847 | 3/1983 | Daniel et al. ............. 364/174 |
| 4,471,450 | 9/1984 | Arnason et al. .......... 364/559 |
| 4,551,664 | 11/1985 | Wong et al. .............. 364/174 |
| 4,586,136 | 4/1986 | Lewis ....................... 364/558 |
| 4,604,737 | 8/1986 | Hoffman ................... 364/418 |
| 4,611,923 | 9/1986 | Kawahara ................. 368/10 |

Primary Examiner—Felix D. Gruber
Assistant Examiner—V. N. Trans
Attorney, Agent, or Firm—Townsend & Townsend

[57] ABSTRACT

A device for indicating a physical quantity such as depth in water by means of a pointer moving around a numbered face, using a C-MOS type computer for sampling the physical quantity at regular intervals and calculating the increment between the preceding value and the last value of the physical quantity. A pulse motor drives the pointer as many steps as are required for reaching the position at which the pointer indicates the last value of the physical quantity. The use of a sampling system and a pulse motor renders the device small enough so that it can be incorporated in a wrist watch.

4 Claims, 8 Drawing Figures

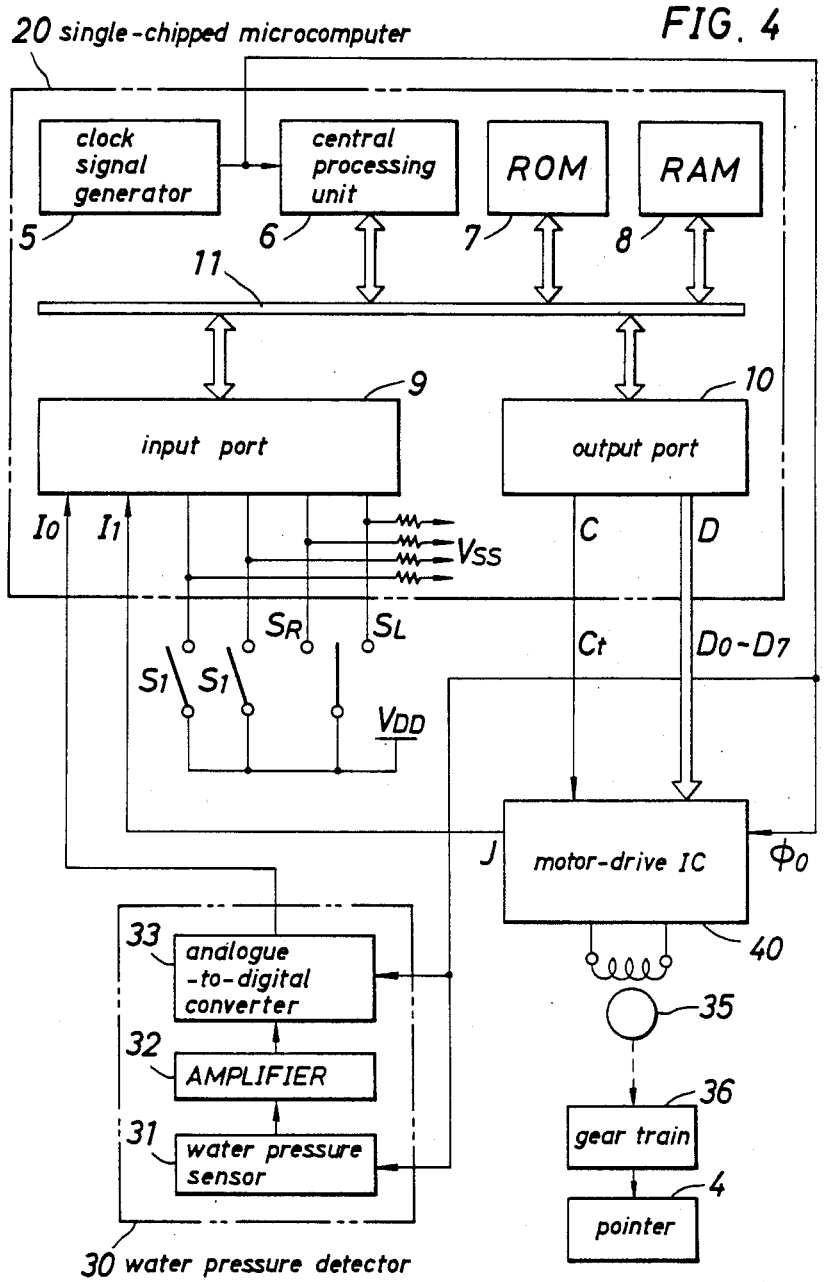

PHYSICAL QUANTITY INDICATING DEVICE BY A POINTER

BACKGROUND OF THE INVENTION

1. Field of the Invention

The present invention relates generally to a device for measuring and showing a physical quantity such as the depth of water (in terms of water pressure), the altitude of a flying object (in terms of atmospheric pressure) or other physical quantities by means of a pointer moving around a numbered face, and particularly to such a gauge using a pulse motor of reversible type for driving an associated pointer.

Japanese Patent Application Laid-Open Nos. 56-19480 and 58-193466 show a digital type water depth gauge in which an analogue value of a water pressure provided by a water-pressure sensor is converted to a corresponding digital value, and then the digital value is shown by an electro-optical display device appropriate for the purpose.

In case that a liquid-crystal display device is used, the device advantageously requires a relatively small amount of electric power for driving the same, but disadvantageously the display presented thereby is hardly visible at a water depth where the light is dim. In case that a light emitting diode or any other light emitting display device is used, advantageously the device can present a visible in the dark in water, but disadvantageously it requires a relatively large amount of electric power for operation.

Still disadvantageously the degree of freedom with which the appearance of the display device is designed is limited if a liquid crystal display, a light emitting diode or any other electro-optical digital display device is used. For instance, if it is desired that a watch for diver's use is equipped with a water depth gauge, the use of an analogue type gauge using a pointer moving around a numbered face is, in fact, effective to expand horizon in ornamental designing. There are, however, problems as to how a pointer is driven to follow the varying water depth. Assume that use is made of a pointer-driving system as found in a voltmeter. Then, an electric current would have to be continuously supplied to an associated coil to show the water depth all the time. This requires too large an amount of electric power for a wrist watch using a minute cell to supply to a water depth gauge. An attempt to use an intermittent driving type electric-to-mechanical converter or a pulse motor in the hope of taking advantage of less electric power consumption, however, has been deadended because of the lack of control means appropriate for permitting the pointer to follow the varying water depth. Thus, there has been no analogue type water depth gauge among those which use electronic devices for measuring and indicating the depth in water.

SUMMARY OF THE INVENTION

One object of the present invention is to provide an analogue type instrument for measuring and indicating a physical quantity using a pulse motor for driving the pointer and a C-MOS type microcomputer requiring a as little electric power as possible, and hence being appropriate for incorporation in as small a device as a wrist watch.

Another object of the present invention is to provide such an analogue type instrument permitting the versatility of designing the pleasing appearance of a device in which the instrument can be incorporated in similar devices of the same design without additional cost, and requiring the shortest possible length of time for reducing a new design to production.

BRIEF DESCRIPTION OF THE DRAWINGS

Other objects and advantages of the present invention will be better understood from the description of preferred embodiments of the present invention, which are shown in the accompanying drawings:

FIG. 4 is a block diagram of a water-depth indicating circuit according to another embodiment of the present invention;

DETAILED DESCRIPTION OF PREFERRED EMBODIMENTS

Figure 1:
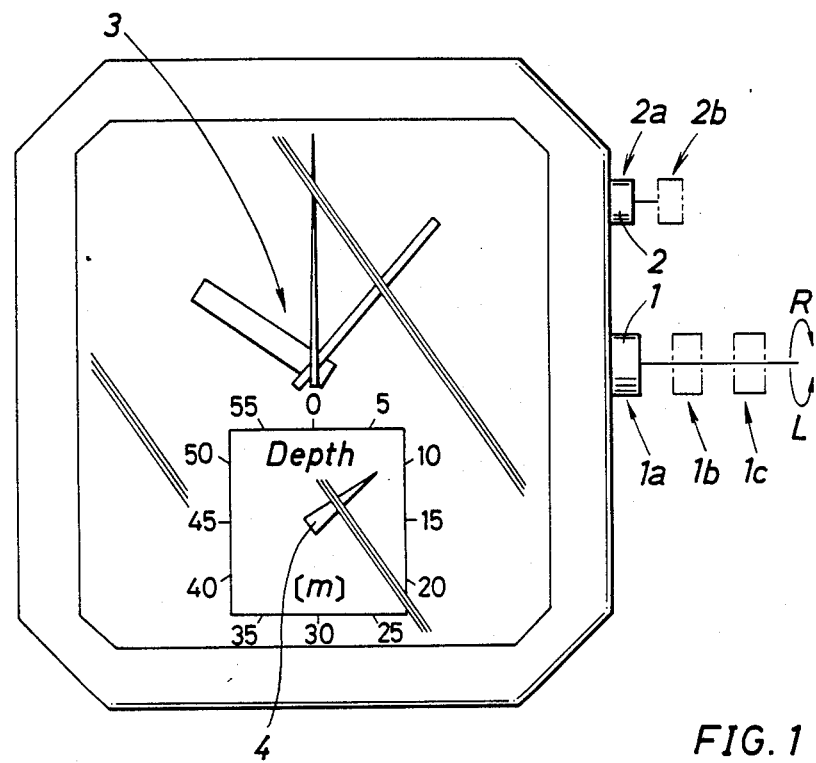
FIG. 1 shows the face of a wrist watch equipped with a water depth gauge according to the present invention.
Figure 2:
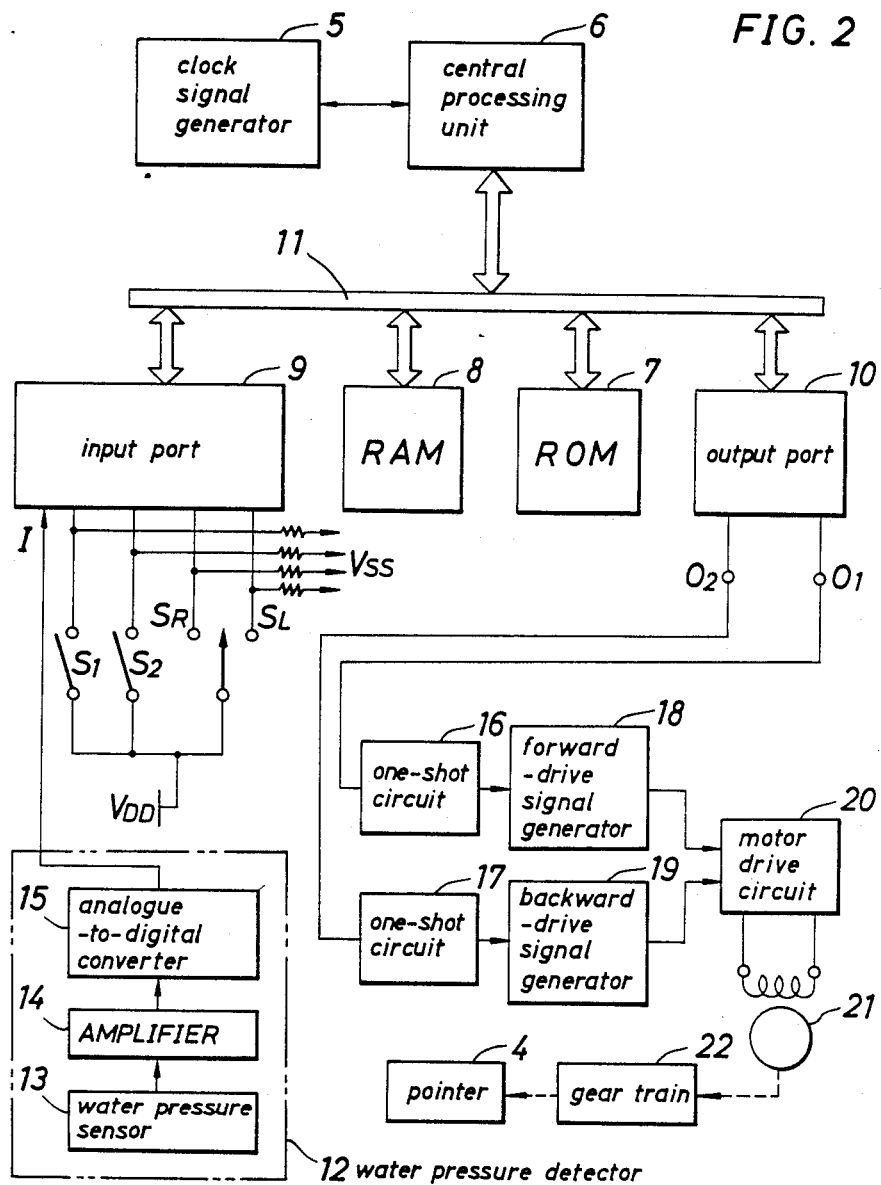
FIG. 2 is a block diagram of water-depth indicating circuit according to one embodiment of the present invention.

FIGS. 1 and 2 show a wrist watch equipped with a water depth gauge according to one embodiment of the present invention.

First, FIG. 1 shows the appearance of a water depth gauge-equipped wrist watch for diver's use.

As shown in the drawing, the watch has a crown 1 and a "push-and-pull" button 2 as exteriorly-accessible or finger-operating members, and hour, minute and second hands 3 for indicating time and a pointer 4 for indicating the depth of water. Also, it has a water depth sensor (not shown). The crown 1 of the watch can be rotated clockwise and counterclockwise, and it can be pulled out and set at two different subsequent positions "1b" and "1c" other than the ordinary position "1a". The button 2 can be set at ordinary and "pull-out" positions "2a" and "2b".

The watch can be set right by pulling and setting the crown 1 and the second "pull-out" position 1c and by rotating the crown 1 clockwise R or counterclockwise L thereby advancing the hour and minute hands 3 forward or backward. As for the button 2, if it is brought to the "push-in" position "2a", the water depth gauge is put in operation whereas if it is brought to the "pull-out" position "2b", the water depth gauge is put in inoperative position. In this connection the water tightness between the button 2 and the watch housing is designed more perfect in the "push-in" position of the button than in the "pull-out" position of the button.

FIG. 2 shows a block diagram of a water depth gauge using a microcomputer according to the present invention. The water depth gauge is shown as including a clock signal generator 5, a central processing unit (CPU) 6, a read only memory (ROM) 7 for storing a given program and other pieces of information, a random access memory (RAM) 8, and input-port 9 and an output-port 10. The central processing unit 6, the read only memory 7, the random access memory 8, the input port 9 and the output port 10 are connected to each other by a bus line 11 consisting of a data bus, an address bus and a control bus.

A switch $S_1$ is connected to the input port 9, and is so designed that it turns on when the crown 1 is pulled one step to the first "pull-out" position "1b". A switch $S_2$ is connected to the input port 9, and is so designed that it turns on when the button 2 is pushed to the "push-in" position "2a". Switches $S_R$ and $S_L$ are connected to the input port 9, and are designed so as to turn on by rotating the crown 1 clockwise R and counterclockwise L, respectively.

A water pressure detector 12 supplies to the input terminal I of the input port 9 signals representing values of water pressure sampled at regular intervals. The water pressure detector 12 is composed of a water pressure sensor 13, an amplifier 14 for amplifying signals from the water pressure sensor 13 and an analogue-to-digital converter 15 for converting the analogue signals from the amplifier 14 to corresponding digital signals. The water pressure sensor 13 is responsive to sampling signals at regular intervals from the clock signal generator 5 for providing signals representing values of water depth at regular sampling intervals. For the sake of simplicity in the drawing the connections by which clock or sampling signals are sent to the water pressure sensor 13 are omitted.

The output terminals $O_1$ and $O_2$ of the output port 10 are connected to a forward-drive signal generator 18 and a backward-drive signal generator 19 via associated one-shot circuits 16 and 17, respectively. The signals appearing at the output terminals of the forward-drive signal generator 18 and the backward-drive signal generator 19 are directed to a motor drive circuit 20 for driving an associated pulse motor 21 forward and backward, respectively. The pulse motor 21 drives the pointer 4 of the water depth gauge clockwise or counterclockwise via an associated train of gears 22. The pulse motor 21 is of reversible type, as is shown in Japanese Patent Application Laid-Open No. 52-80063. Means for providing forward- and backward-drive signals is described in this Japanese Patent Application, too. Only for the sake of simplicity the connections by which clock signals are sent to the forward-drive signal generator 18 and the backward-drive signal generator 19 are omitted.

FIG. 3 is a flow-chart describing the control program for the operation of the water depth gauge, which control program is stored in the read only memory 7.

Figure 3A:
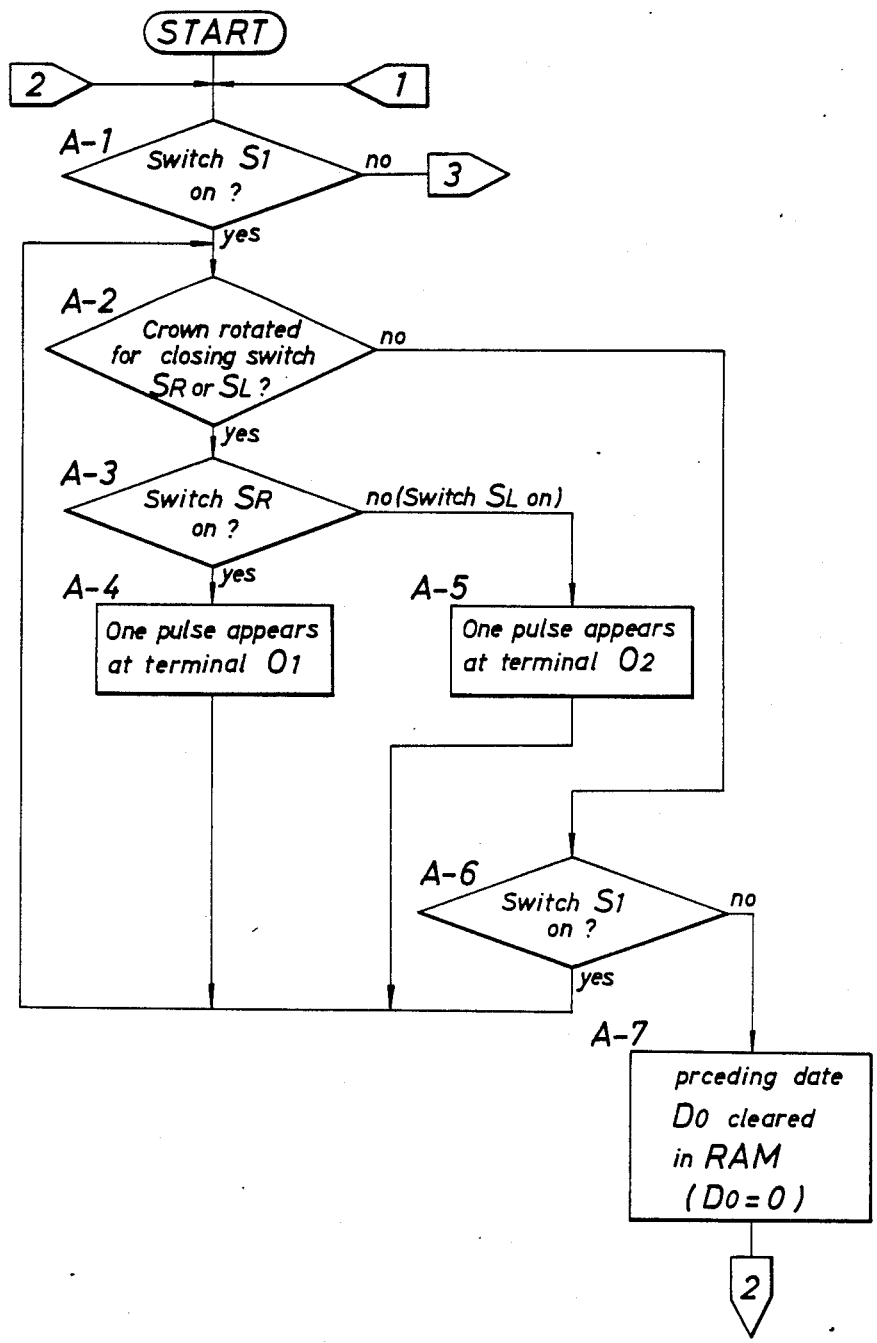
FIGS. 3A and 3B in combination is a flow-chart describing the operation of the water-depth gauge according to the present invention.
Figure 3B:
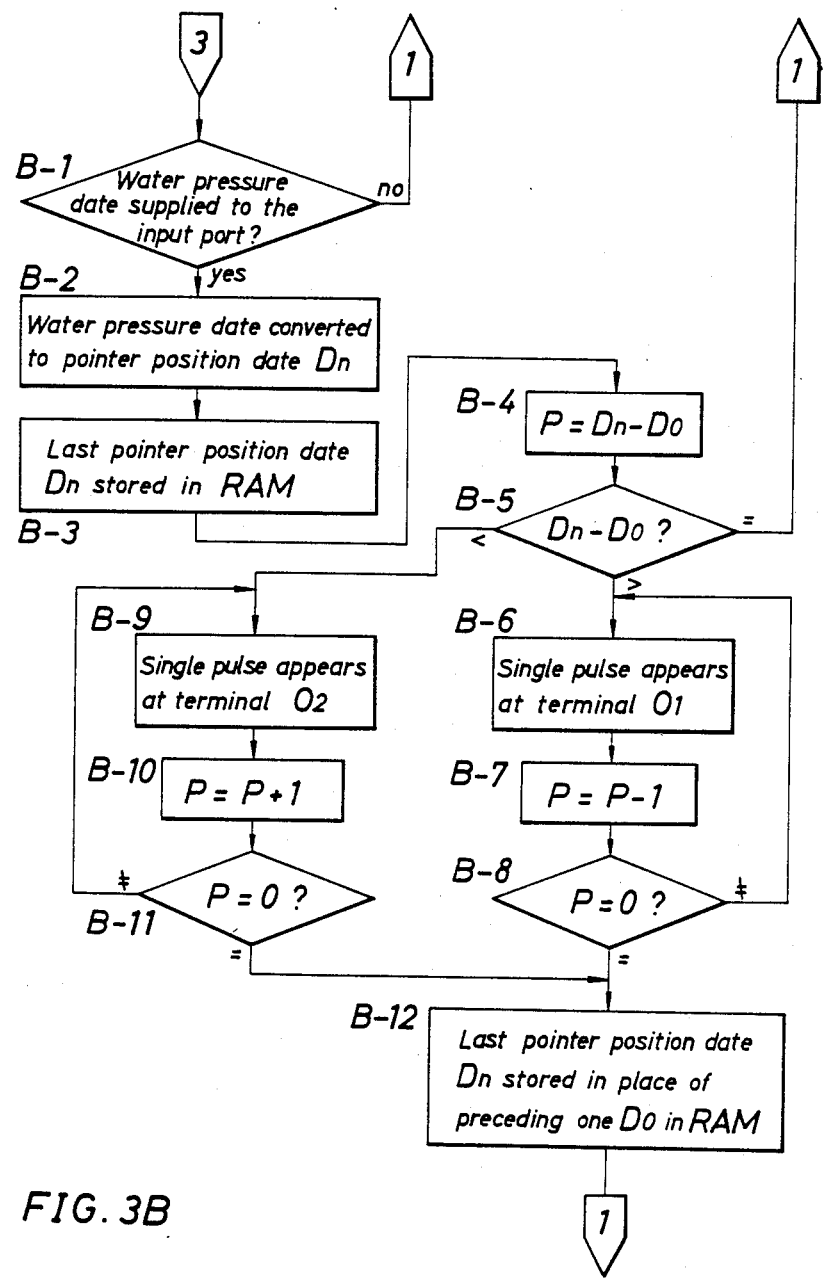

The operation of the water depth gauge according to the present invention is described hereinafter with reference to FIGS. 3A and 3B. FIGS. 2, 3A and 3B, however, do not show the part of watch for controlling the hour, minute and second hands because it does not constitute any part of the present invention.

First, the button 2 is pushed and brought to the "push-in" position "2a", thereby causing the switch $S_2$ to turn on and bringing the water depth gauge in its operative position. Then, the operation program starts. It, however, should be understood that the button 2 be operated on land to start the operation of the water depth gauge because otherwise the operation of the button 2 in water would cause the invasion by water into the interior of the watch.

In this connection when the operation of the water depth gauge starts, no water pressure is applied to the water pressure sensor 13 of the gauge. If the pointer 4 should not indicate zero, the pointer 4 must be reset on land. Therefore, the description begins with the operation of resetting the pointer 4 of the water depth gauge.

If it is desired that the pointer 4 of the water depth gauge is reset, the crown 1 is pulled one step to bring the same to the first "pull-out" position "1b" while the button 2 remains at the "push-in" position "2a". As a consequence, the switch $S_1$ turns on, thereby causing the situation to proceed from Step A-1 to Step A-2 where the switch closing by the rotation of the crown is waited for.

Assume that an input signal is supplied to the input port 9 via the switch $S_R$ by rotating the crown 1 clockwise (Step A-3). Then, a pulse signal appears at the output terminal $O_1$ of the output port 10 (Step A-4) to travel to the forward-drive signal generator 18. The forward-drive signal generator 18 provides a forward-drive signal to the pulse motor 21, thereby causing the pulse motor 21 to advance one step in the forward or clockwise direction. Accordingly, the pointer 4 of the water depth gauge advances one step in the forward or clockwise direction.

Contrary to the above, assume that an input signal is supplied to the input port 9 via the switch $S_L$ by rotating the crown 1 counterclockwise. Then, a pulse signal appears at the output terminal $O_2$ of the output point 10 (Step A-5) to travel to the backward-drive signal generator 19. The backward-drive signal generator 19 provides a backward-drive signal to the pulse motor 21, thereby causing the pulse motor 21 to advance one step in the backward or counterclockwise direction. Accordingly, the pointer 4 of the water depth gauge advances one step in the backward or counterclockwise direction.

In either case above described, after Step A-4 or Step A-5 the situation will return to Step A-2 where the rotation of the crown 1 for supplying an input signal to the input port 9 is waited for. If no input signal appears within a predetermined length of time (for instances 0.5 second), the situation proceeds to Step A-6 where a determination is made as to whether the switch $S_1$ is closed or not. In the affirmative case of the situation proceeds to Step A-2 where the rotation of the crown for providing an input signal to the input port is waited for. In the negative case the situation proceeds to Step A-7 where the content of the random access memory 8 (i.e., the storage $D_O$ of the preceding or last but one data contained in the random access memory as later described) is cleared, and then the situation returns to the initial position, that is, "Start".

In brief, if it is desired that the pointer 4 of the water depth gauge is reset, the crown 1 of the watch is pulled one step and is brought to the first "pull-out" position "1b", and then the crown 1 is rotated clockwise or counterclockwise to advance the pointer 4 clockwise or counterclockwise until it reaches zero.

Next, the button 2 is pushed in and brought to the "push-in" position on land, thereby bringing the water depth gauge in its operative position. The crown 1 of the watch is at the normal position "1a", thus keeping the switch $S_1$ off. Therefore, the situation proceeds from Step A-1 to Step B-1 where the supply of water pressure data to the input terminal I of the input port 9 is waited for.

Assume that the water pressure detector 12 provides water pressure data at regular sampling intervals. Then, the situation proceeds to Step B-2 where the central processing unit 6 converts the water pressure data to corresponding data Dn representing the position of the pointer for indicating the depth of water, which data Dn is hereinafter referred to as "pointer position data".

In this particular embodiment, one step advance in the pulse motor 21 causes one step advance of the pointer 4 to indicate one meter increment of water depth. In this connection, in converting water depth data to corresponding pointer position data Dn in the central processing unit 6, the value of water depth is rounded to the nearest whole number in meters.

The situation proceeds to Step B-3 where the last pointer position data Dn is stored in the last data storage section in the random access memory 8; Step B-4 where the difference P between the last pointer position data Dn and the preceding or last but one pointer position data Do, which is stored in the preceding data storage section in the random access memory 8, is calculated (thus, the difference P representing the number of steps taken by the pulse motor 21 and hence by the pointer 4 of the water depth gauge); and Step B-5 where comparison and decision is made as to which data is larger, the last data Dn or the preceding or last but one data Do.

Assume that the last pointer position data Dn is equal to the preceding or last but one pointer position data Do (i.e., $Dn - Do = 0$, and hence $P = 0$). The value of water depth remains unchanged. Then, the situation returns to the initial position immediately.

Assume that the last pointer position data Dn is larger than the preceding one Do (i.e., $Dn - Do > 0$, and hence $P > 0$). The water depth shows an increase over the one measured at the preceding sampling time, and therefore the situation proceeds to Step B-6 where a single pulse is caused to appear at the output terminal $O_1$ of the output port 10. Then, the step motor 21 is made to advance one step, and accordingly, the pointer 4 of the water depth gauge is made to advance one step clockwise. Thereafter, the situation proceeds to step B-7 where the value of the difference P between the last and preceding or last but one data which is stored in the "P" storage section of the random access memory 8 is reduced by one; and then to Step B-8 where a clock is made as to whether P reduces to zero. If P is not zero, the situation returns to Step B-6 where a single pulse is caused to appear at the output terminal $O_1$ of the output port 10, and then the same proceedings as mentioned above will be repeated until the difference P reduces to zero.

When the difference P is zero, indicating that the pointer 4 should be left in the position in which it indicates the last pointer position data Dn, the driving of the pulse motor 21 is terminated. Then, the situation proceeds to Step B-12 where the content in the random access memory 8 is renewed to store the last pointer position data Dn in place of the preceding pointer position data Do, and then the situation returns to the initial position, that is, Start.

When the last pointer position data Dn is compared with the previous pointer position data Do at Step B-5 to find the former Dn is smaller than the latter Do (i.e., $Dn - Do < 0$, and hence $P < 0$), the value of water depth shows a decrease below the one measured at the previous sampling time. Then, the situation proceeds to Step B-9 where a single pulse is caused to appear at the output terminal $O_2$ of the output port 10. Thus, the step motor 21 is driven one step counterclockwise, and accordingly the pointer 4 is made to advance one step counterclockwise. Thereafter, the situation proceeds to Step B-10 where the value of the difference P is increased by one, and then to Step B-11 where a check is made as to whether the value of difference P is zero or not. In the negative case the situation returns to Step B-9 where a single pulse is caused to appear at the output terminal $O_2$ of the output port 10, and then the same proceedings as described above will be repeated until P reduces to zero. Contrary to the above, in the affirmative case or if the difference P is zero, indicating that the pointer should be left in the position in which the pointer 4 shows the last pointer position data Dn, the driving of the pulse motor is terminated, and the situation proceeds to Step B-12 where the random access memory 8 is renewed to present the last pointer position data Dn, and then the situation returns to the initial position, that is, "Start".

After returning to the start position, the subsequent water pressure sampling is performed unless the crown 1 is put in the first "pull-out" position "1b" for resetting the water depth gauge. The situation proceeds to Step B-1 where the supply of water depth data from the water depth detector 12 to the input terminal I of the input port 9 is waited for, and then the same procedings as mentioned above will be repeated. Thus, as far as the watch is operated in the mode of measuring and indicating the depth of water, the procedings from Step B-1 to Step B-12 are repeated for each sampling.

The water pressure detector 12 is constructed so as to provide water pressure data at each predetermined sampling period. If the sampling period is set at a relatively large value, and if the detector is constructed so as to perform the first sampling immediately after bringing the "push-and-pull" button 2 to the "push-in" position 2a, a decision can be made immediately as to whether it is necessary to reset the water depth gauge.

FIG. 4 shows a circuit diagram of a water depth gauge according to another embodiment of the present invention. In the drawing the same units as appear in FIG. 1 are indicated by the same reference numerals as used in FIG. 1, and explanations of the same units as appear in FIG. 1 are omitted in the following description of the water depth gauge of FIG. 4.

In the water depth gauge circuit according to this embodiment a single chip C-MOS type microcomputer is used. The water depth gauge of FIG. 4 is different from the one of FIG. 1 in that: in the water depth gauge of FIG. 4 a indicating signal J is directed from an integrated circuit 40 for driving an associated motor (later described) to the input terminal $I_1$ of the input port I, and, on the other hand, data signals $D_0-D_7$ from the output terminal D of the output port 10 and control signals Ct from the output terminal C of the output point 10 are directed to the motor-driving integrated circuit 40. Nothing else is different from the structure of FIG. 1.

Figure 5:
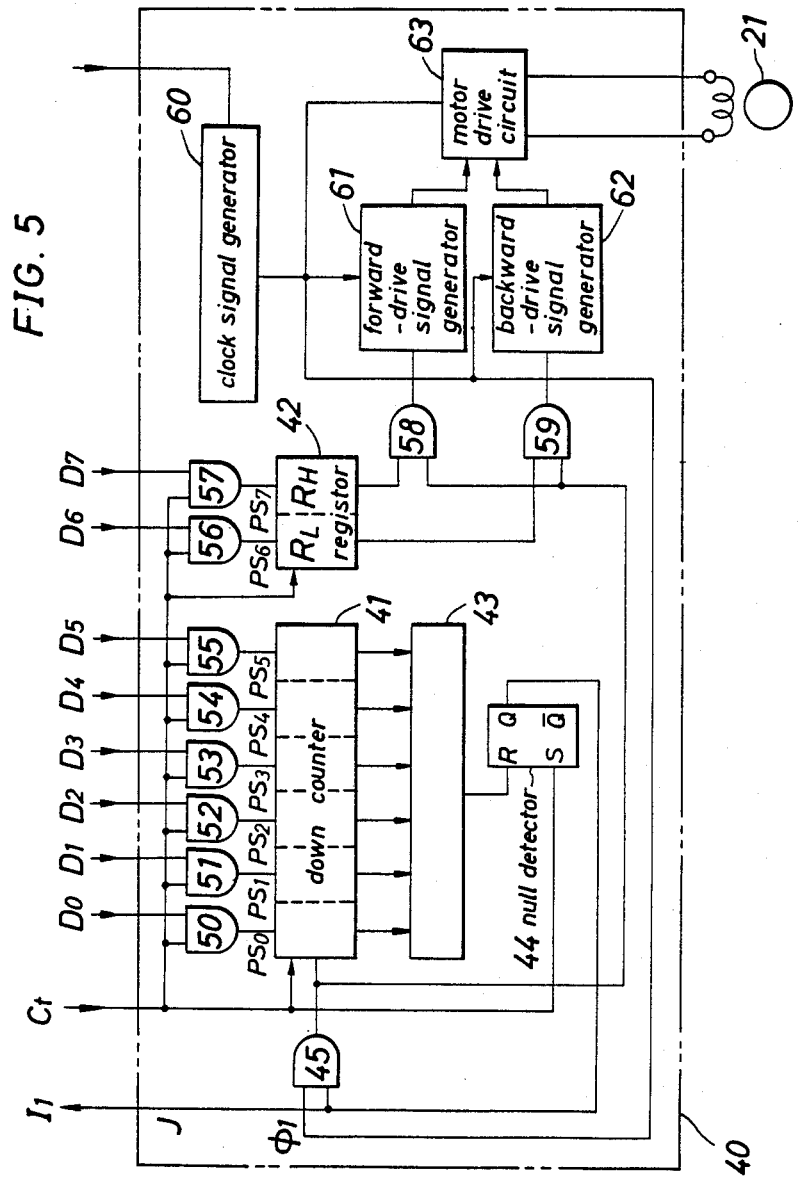
FIG. 5 shows a wiring diagram of an integrated circuit for use in driving a pulse motor in the water depth gauge of FIG. 4.

FIG. 5 shows the wiring diagram of the motor-driving integrated circuit 40 as including a preset type down-counter 41; a resistor 42 for storing motor driving direction signals; and a zero detector circuit 43, which is designed to provide a single pulse the instant that the content of the present counter 41 reduces to zero.

Forward- and backward-drive signal generators 61 and 62 are responsive to each pulse signal when applied via AND gates 58 and 59 for providing forward- and backward-drive signals to an associated motor 21 for clockwise and counterclockwise rotation respectively. The forward- and backward-drive signals are directed to a motor drive circuit 63 (which is composed mainly of an electric current amplifying C-MOS inverter), and then the amplified drive signals are supplied to a pulse motor 21 to drive the motor clockwise or counterclockwise. Accordingly the pointer 4 of the water depth gauge is rotated clockwise or counterclockwise through the agency of gears 22.

The pulse motor 21 is reversible type. Such a reversible type pulse motor and forward- and backward-signal generators may be those ones which are described in Japanese Patent Application Laid-Open No. 52-80063.

A clock signal generator 60 is responsive to the oscillation signal from the clock signal generator 5 for providing clock signals which are required for controlling selected units synchronous with each other in the motor drive integrated circuit 40.

Now, the operation of the motor drive integrated circuit of FIG. 5 is described.

Six AND gates 50 to 55 are responsive to the control signal Ct and the output terminal C of the output port 10 for allowing six least significant bits $D_0$ to $D_5$ of an eight-bit data, which is composed of $D_0$ to $D_7$ and appears at the output terminal D of the output port 10, to enter the down-counter 41 through its input terminals $PS_0$ $PS_5$ constituting together a preset data entrance, whereas the remaining two AND gates 56 and 57 are responsive to the signal Ct for allowing two most significant bits $D_6$ and $D_7$ of the eight-bit data to enter the register 42 through its input terminals $PS_6$ and $PS_7$. Thus, when a single control signal Ct appears at the output terminal C of the output port 10, the AND gates 50–57 allow an eight-bit data $D_0$ to $D_7$ to enter the down-counter 41 and the register 42. As for a two-bit signal which is composed of $D_6$ and $D_7$ and is applied to the register 42, it should be noted that one of these bit signals is logic 1 (high level) and that the other is logic 0 (low level). Therefore, if $D_7$ is logic 1, $R_H$ stores logic 1, thereby putting an associated AND gate 58 in its open condition for a signal of logic 1, whereas if $D_6$ is logic 1, $R_L$ stores logic 1, thereby putting an associated AND gate 59 in its open condition for a signal of logic 1. In brief, one of these AND gates 59 and 59 is brought to its open condition in response to the simultaneous appearance of $D_6$, $D_7$ and Ct.

The control signal Ct is applied to a flip-flop circuit 44, thereby setting the flip-flop circuit 44 and consequently putting an associated AND gate 45 in its open condition. Then, clock signals $\phi_1$ at a frequency ranging from 16 to 128 $H_Z$ are supplied by the clock signal generator 60 to the AND gate 45, they are allowed to pass to the down counter 41 through the AND gate 45. At the same time, the clock signals $\phi_1$ are allowed to pass to either one of the forward- and backward-drive signal generators 61 and 62, depending on which AND gate 58 or 59 is made open (and on which one of two most significant bits storing sections $R_H$ and $R_L$ stores logic 1). Thus, the forward- or backward-drive signal generator 61 or 62 supplies a forward- or backward-drive signal for advancing an associated pulse motor 21 step by step clockwise or counterclockwise every time a clock signal $\phi_1$ is applied to the motor drive circuit 63 via the forward- or backward-drive signal generator 61 or 62.

The down counter 41 performs "counting-down" in response to each clock signal $\phi_1$ applied thereto through the AND gate 45. When the content o the down counter 41 reduces to zero, an associated null detector circuit 43 provides a pulse signal to the "R" terminal of the flip-flop 44, thus resetting the flip-flop 44 to put the AND gate 45 to its closed condition. As a consequence, clock signals $\phi_1$ are prevented from entering the down-counter 41, and at the same time, the motor drive circuit via the forward- and backward-drive signal generators 61 and 62. Thus, the driving of the pulse motor 21 is made to cease.

As is understood from the above, in this particular embodiment the null detector circuit 43, the flip-flop circuit 44, the AND gates 45, 58 and 59, and the forward- and backward-drive signal generators 61 and 62 together control the pulse motor 21 so as to advance as many steps as the number registered in the down counter 41 in the direction as set by the register 42. The signal appearing at the output terminal Q of the flip-flop 44 is applied to the input terminal $I_1$ of the input port 9 as a run-or-stop indicating signal J representing that the pulse motor 21 runs or stops. Specifically, if the pulse motor 21 runs, the signal J is logic 1 (high level) whereas if the pulse motor 21 stops, the signal J is logic 0 (low level).

Figure 6A:
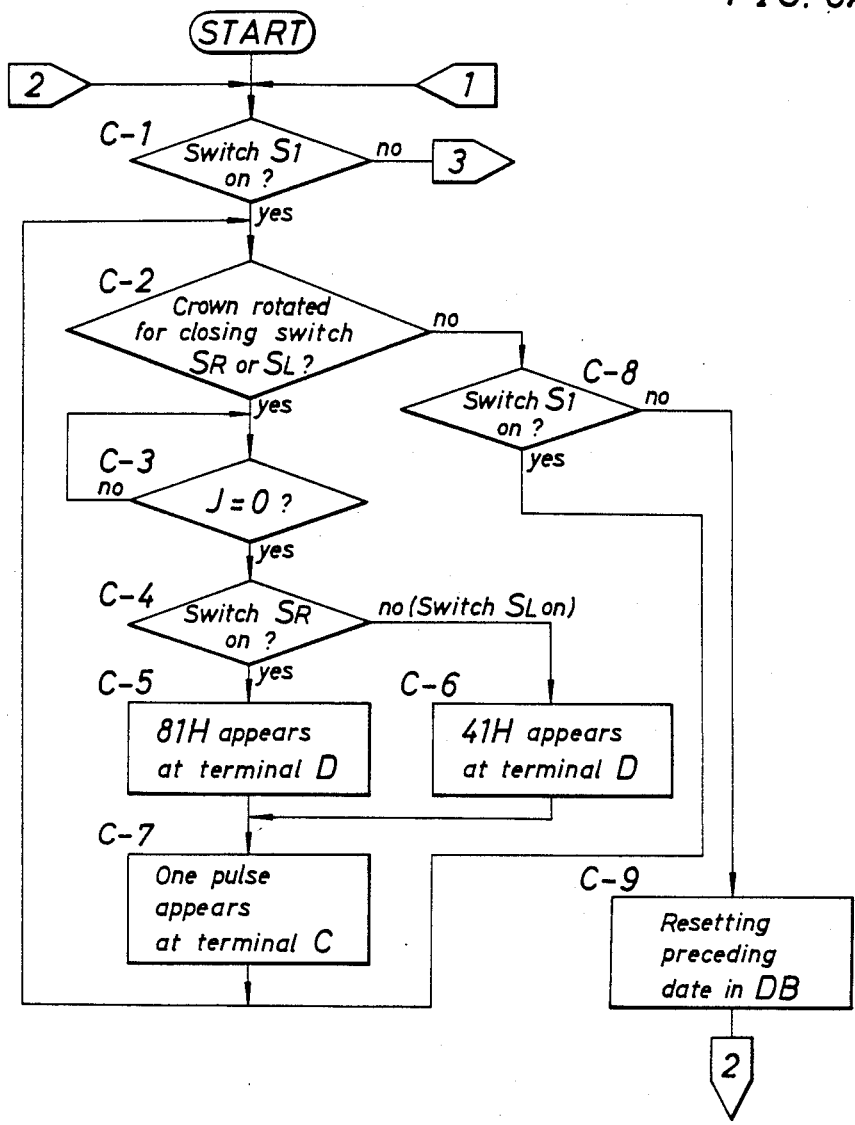
FIGS. 6A and 6B in combination is a flow-chart describing the operations of the water depth gauge of FIG. 4.
Figure 6B:
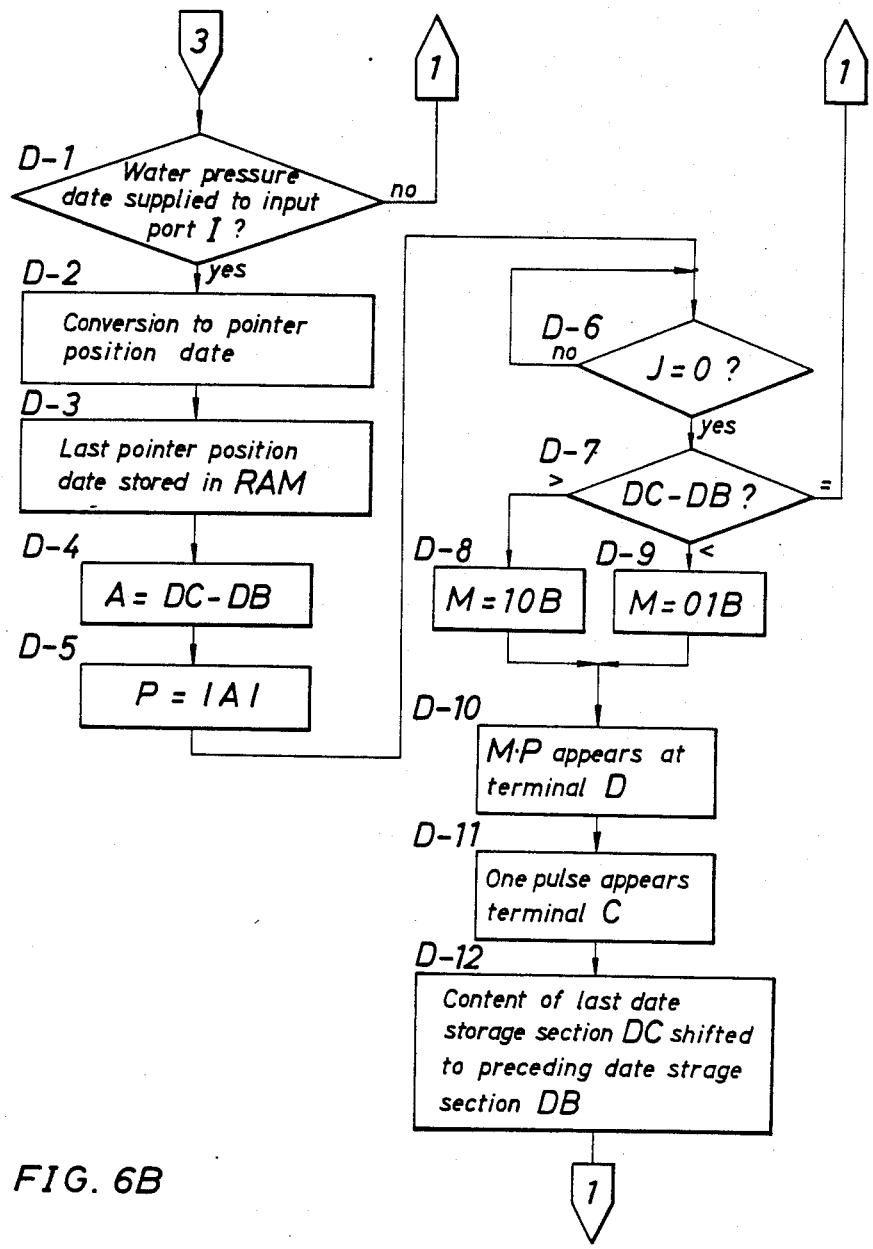

FIGS. 6A and 6B show a flow-chart showing the procedings of the operation of the water depth gauge stored in the read only memory 7. The operation of the water depth gauge of FIG. 4 is described below with the reference to the flow-chart of FIG. 6. The operation of driving the hour, minute and second hands of the watch, however, is not described because it does not constitute any part of the present invention.

First, the button 2 is put in the "push-in" position 2a to close the switch $S_2$, thus putting the water depth gauge in the initial or start position. The push or pull of the button 2 should be conducted on land because otherwise, water may invade in the interior of the watch.

The operation of resetting the water depth gauge is the same as in the first embodiment described above (see FIGS. 2 and 3), and therefore the description of Steps C-1 and C-2 are omitted.

Assume that the run-or-stop indicating signal J is logic 0 (step C-3), representing that the content of the register is null, and that the pulse motor stops. If an input signal is applied to the input port through the switch $S_R$ by rotating the crown 1 of the watch clockwise (Step C-4), an output signal representing sexadecimal notation data 81H appears at the output terminal D of the output port 10 (Step C-5). If an input signal is applied to the input port through the switch $S_L$ by rotating the crown 1 of the watch counterclockwise, an output signal representing sexadecimal notation data 41H appears at the output terminal D of the output port 10 (Step C-6).

Then, assume that a control signal Ct appears at the output terminal C of the output port 10 (Step C-7). If the outputted data is 81H, the most significant bit in the section $R_H$ of the register 42 is logic 1. If the outputted data is 41H, the second most significant bit in the section $R_L$ of the register 42 is logic 0. In either case the down counter 41 is preset at logic 1.

In case that the outputted data is 81H, the forward-drive signal generator 61 provides a forward-drive signal, thereby driving the pulse motor 21 one step clockwise via the motor drive circuit 63. Then, the pulse motor 21 is driven one step clockwise, and accordingly, the pointer 4 of the water depth gauge is advanced one step in the same direction. Contrary to this, in case that the outputted data is 41H, the backward-drive signal generator 62 provides a backward-drive signal to the circuit 22 thus causing the pulse motor 21 and hence the pointer 4 of the water depth gauge to advance one step counterclockwise.

In either case after finishing all the incidents programmed as far as Step C-7, the situation returns to Step C-2 where application of an input signal through either switch $S_R$ or $S_L$ by rotating the crown 1 of the watch is waited for. If no input signal is applied within a predetermined length of time (for instance 0.5 second), the situation proceeds to Step C-8 where a decision is made as to whether the switch $S_1$ is closed or not. In the affirmative case the situation returns to Step C-2 where the rotation of the crown of the watch is waited for. In the negative case, that is, if the switch $S_1$ turns off, the situation returns to the initial position or "Start" after resetting the content of the preceding storage section DB in the random access memory at Step C-9.

If it is desired that the pointer 4 of the water depth gauge is reset, the crown 1 of the watch is brought to the first "pull-out" position 1b, and then the crown 1 is rotated clockwise or counterclockwise until the pointer 1 reaches zero.

Next, assume that the button 2 is brought to the "push-in" position 2a on land, thereby putting the water depth gauge in its operative condition and that the pointer 4 of the water depth gauge stays at zero, requiring no resetting. Then, the operation of the water depth gauge is:

The crown 1 of the watch is set at its normal position 1a, thus maintaining the switch $S_1$ open. Then, the situation proceeds from Step C-1 to Step D-1 where supply of water pressure data to the input terminal I of the input port 9 is waited for.

The water pressure detector 30 supplies water pressure data at regular sampling intervals, and the situation proceeds to Step D-2 where the central processing unit 6 converts the water pressure data to corresponding pointer position data "d" (representing the position at which the pointer 4 indicates a water depth on the face of the water depth gauge).

In this particular embodiment when the pulse motor 21 advances one step, the pointer 4 of the water depth gauge advances one step corresponding to one meter depth in water. In this connection calculation as required for converting the water pressure data to the pointer position data in the central processing unit is performed by rounding to the nearest whole number in meters.

The situation proceeds to Step D-3 where the last pointer position data is stored in the last pointer position data storing section of the random access memory 8; Step D-4 where the difference A between the last and preceding on last but one pointer position data is determined; and Step D-5 where the absolute value of the difference A (corresponding to the number of the steps taken by the pulse motor 21 or the pointer 4 of the water depth gauge before indicating the depth of water sampled at the last time) is obtained.

When the signal J represents the null condition in the register at Step D-6, the situation proceeds to Step D-7 where a comparison is made to find which data is larger, the last or preceding or last but one data.

If the last data is equal to the preceding one (that is, A=0 or P=0), the depth of water remains unchanged, and there is no necessity of moving the pointer 4 of the water depth gauge. Then, the situation returns to start.

If the last data is larger than the preceding one, or the difference A is positive in sign, the situation proceeds to Step D-8 where a binary number 10 (B) is set for the most and second most significant digits $D_7$ and $D_6$ of an eight-bit data $D_0$–$D_7$, and is outputted from the output terminal D of the output port 10 for storing in the register 42. (These most and second most significant digits are referred to as "data M".) If the last data is smaller than the preceding one, or the difference A is negative in sign, the situation proceeds to Step D-9 where a binary number 01 (B) is set as data M in the register 42. As regards the remaining less significant six digits $D_0$ to $D_5$, they are constituted by data P (=1A1) described above.

As Step D-10 a data M·P or an eight-digit data $D_0$ to $D_7$ appears at the output terminal D of the output port 10, and then at Step D-11 a control pulse Ct appears at the output terminal C of the output port 10. Thus, the data M·P is set in the down counter 41 and the register 42.

Through the agency of the motor drive integrated circuit 40 the pulse motor 21 advances as many steps as the number stored in the down counter 41 in the direction determined by the content of the register 42, thereby driving the pointer 4 of the water depth gauge accordingly. For example, if data M·P is 82H, the content of the down counter 41 is set at 2 when the most and second most significant bits $R_H$ of the register 42 are set at 1, and then the pulse motor 21 advances one step clockwise. For another example, if data M P is 4AH, the content of the down counter 41 is set at AH when the second most significant bit $R_L$ is set at 1 in the register 42, and then the pulse motor 21 advances ten steps counterclockwise.

As for the single chip microcomputer 20, the situation proceeds to Step D-12 where the storage section DC of the random access memory 8 is renewed to store the last data d in place of the preceding one, and then the situation returns to the initial position, that is, "Start".

Unless the crown of the watch is put in the first "pull-out" position 1b for resetting the water depth gauge, the situation proceeds to Step D-1 where the supply of water pressure data to the input terminal $I_0$ of the input port 9 is waited for, and then the proceedings above described will be repeated. Specifically a series of proceedings from Step D-1 to Step D-12 will be repeated for each sampling period.

As may be understood from the above, a water depth gauge according to the present invention uses a pulse motor, thereby permitting the pointer of the water depth gauge to follow the sampling of water pressure for indicating the value of water pressure sampled at regular intervals. This is most effective to reduce electric power consumption to a possible minimum.

Although the present invention is described as being applied to a water depth gauge, it can be equally applied to a device for measuring a physical quantity which varies with time.

The use of a C-MOS type microcomputer in a water depth gauge according to the present invention is advantageous to production of varieties each in small numbers to meet needs for variant products in market because of permitting the reduction of the cost in production and of shortening the length of time required for designing. The incorporation of a C-MOS type microcomputer in as small a device as a waist watch is permitted by reducing the size of the microcomputer and at the same time, the consumption of electric power to a possible minimum, which is attained by using a sampling system and an intermittent-drive type electric to-mechanical converter, that is, a pulse motor.

In the water depth gauge described above the pointer thereof is designed so as to rotate 360 degrees. It, however, can be desined so as to rotate a given angular range, for instance, 180 degrees. If the water depth gauge is so designed that a sixty-step advance by a pulse motor in one direction causes a 360 degree rotation of the pointer of the water depth gauge, the pointer of the water depth gauge can be used as a second hand of the watch. Then the watch need be designed so as to be switchable from time measuring mode by operating the crown or an extra button for the purpose. A motor drive integrated circuit may be designed to include a register and a counter for counting the number of motor-driving pulses. Then, the total advance of the pulse motor may be controlled by detecting the correspondence between the content of the register and the count of the counter.

When occasions demand, a motor drive integrated circuit may be designed to include a plurality of groups each consisting of a register, motor-driving signal generator, motor driving circuit and other elements, each group allotted to each of the corresponding plurality of pulse motors.

What is claimed is:

1. A device for indicating a physical quantity comprising:
    a pointer for indicating a physical quantity; a reversible type pulse motor for driving said pointer;
    a detector for detecting said physical quantity at predetermined sampling intervals;
    converting means for converting a sampled value of said physical quantity to an indicating data representing the position of said pointer for indicating said sampled value;
    a first memory for storing said indicating data till next sampling time;
    judging means for judging in which direction said pulse motor is to be driven to provide a data representing the direction of rotation of said pulse motor by comparing the present indicating data with the previous or last indicating data stored in said first memory;
    determining means for determining the amount of rotation of said pulse motor on the basis of the difference between the present indicating data and the previous indicating data to provide a data representing the amount of rotation of said pulse motor;
    a second memory for storing a motor driving information based on said data of direction and amount of rotation of said pulse motor;
    drive-signal producing means for providing a pulse motor-driving signal to drive said motor by the such number of steps in such direction as based on said motor driving information stored in said second memory; and
    a pulse motor driving circuit for amplifying and directing said pulse motor-driving signal to said pulse motor.

2. A device for indicating a physical quantity according to claim 1 further comprising;
    an externally operating switch for putting said device in a resetting mode in which said pointer is brought to the initial start position; and
    another externally operating switch for providing a motor driving signal for resetting said pointer in said resetting mode.

3. A device for indicating a physical quantity according to claim 1 wherein said detector is a water pressure detector, and said converting means is one for converting a sampled value of water pressure to a depth indicating data representing the position of said pointer for indicating said sampled value of water pressure.

4. A device for indicating a physical quantity according to claim 1 wherein said judging means and said determining means are constituted by a C-MOS type microcomputer, and said second memory, said drive-signal producing means and said pulse motor driving circuit are built in a C-MOS type motor driving integrated circuit which is constituted separately from said microcomputer.

* * * * *